(12) United States Patent
Szalay et al.

(10) Patent No.: US 6,358,064 B2
(45) Date of Patent: *Mar. 19, 2002

(54) Z-AXIS ELECTRICAL INTERCONNECT

(75) Inventors: John Steven Szalay, Corona Del Mar; Haim Feigenbaum, Irvine; Eric Dean Jensen, Irvine; Terry Shing Wang, Irvine, all of CA (US)

(73) Assignee: Delphi Technologies, Inc., Troy, MI (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,894

(22) Filed: Mar. 29, 1999

(51) Int. Cl.$^7$ ................................................. H05K 1/00
(52) U.S. Cl. ............................................. 439/67; 439/493
(58) Field of Search ........................ 439/67, 495, 496, 439/492, 493, 494

(56) References Cited

U.S. PATENT DOCUMENTS

| | | | |
|---|---|---|---|
| 5,051,366 A | * | 9/1991 | Anderson et al. .............. 439/67 |
| 5,403,202 A | * | 4/1995 | Roehling ..................... 439/493 |
| 5,928,001 A | * | 7/1999 | Gillette et al. ................ 439/67 |
| 6,039,600 A | * | 3/2000 | Etters et al. ................. 439/496 |
| 6,086,412 A | * | 7/2000 | Watt et al. ................... 439/496 |
| 6,123,551 A | * | 9/2000 | Westfall ....................... 439/67 |

* cited by examiner

Primary Examiner—Gary Paumen
Assistant Examiner—Ross Gushi
(74) Attorney, Agent, or Firm—Thomas N. Twomey

(57) ABSTRACT

A Z-axis electrical interconnect includes a flexible printed circuit folded into a U-shape. The Z-axis electrical interconnect also includes a plurality of raised interconnection members arranged on the flexible printed circuit in a predetermined pattern and a circuit trace interconnecting the pair of raised interconnection members. The Z-axis electrical interconnect further includes a spring fixedly positioned on the flexible printed circuit to maintain the U-shape.

17 Claims, 2 Drawing Sheets

Z-AXIS ELECTRICAL INTERCONNECT

TECHNICAL FIELD

The present invention relates generally to electrical interconnects and, more particularly, to a Z-axis electrical interconnect.

BACKGROUND OF THE INVENTION

Electronic devices are commonly made up of individual components electrically connected together to form a single electrical circuit. An example of an electrical component known in the art is a printed circuit board. Another example is a flexible printed circuit, also known as a flexible circuit. Still another example is an integrated circuit or IC chip. Frequently, it is desirable to connect individual electrical components together. Commonly known electrical interconnection techniques include soldering, socketing, wire bonding, wire button contacts and plug-in connectors.

As electronic devices physically decrease in size, packaging constraints may limit the use of traditional electrical interconnection techniques.

For example, stacked electrical components necessitate the use of a Z-axis electrical interconnect. In the past, a wire button contact was used. However, a disadvantage of a wire button contact as a Z-axis electrical interconnect is that it requires a strict vertical dimensional tolerance between the stacked electrical components. Another disadvantage is that the wire button electrical interconnect may not fit in a low profile space. Thus, there is a need in the art for a Z-axis electrical interconnect that is packagable within a low profile space and provides a more positive electrical contact in interconnecting electrical devices.

SUMMARY OF THE INVENTION

Accordingly, the present invention is a Z axis electrical interconnect. The Z-axis electrical interconnect includes a flexible printed circuit folded into a U-shape. The Z-axis electrical interconnect also includes a plurality of raised interconnection members arranged on the flexible printed circuit in a predetermined pattern and a circuit trace interconnecting the raised interconnection members. The Z-axis electrical interconnect further includes a spring fixedly positioned on the flexible printed circuit to maintain the U-shape.

One advantage of the present invention is that a Z-axis electrical interconnect is provided having a low profile to fit within a limited space. Another advantage of the present invention is that the Z-axis electrical interconnect allows a lower insertion force during installation. Still another advantage of the present invention is that the Z-axis electrical interconnect provides a positive contact in interconnecting stacked electrical components having a large vertical tolerance. A further advantage of the present invention is that the Z-axis electrical interconnect has connections which may also be tailored to have different locations between the two boards, i.e., a smaller pitch on one board and a larger pitch on the other board, because the signal carrying element is built on a flexible printed circuit (FPC).

Other features and advantages of the present invention will be readily appreciated as the same becomes better understood after reading the subsequent description when considered in connection with the accompanying drawings.

DESCRIPTION OF THE PREFERRED EMBODIMENT

Figure 1:
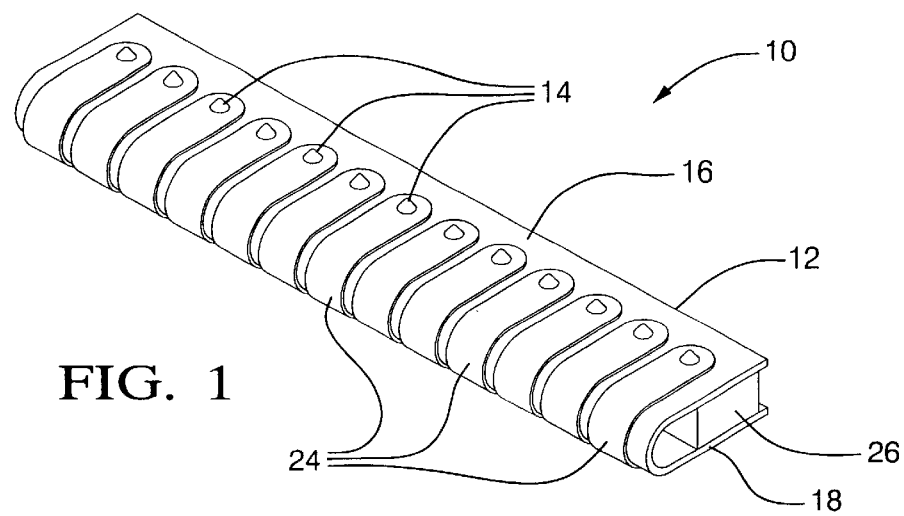
FIG. 1 is a perspective view of a Z-axis electrical interconnect illustrating features of the present invention.
Figure 2:
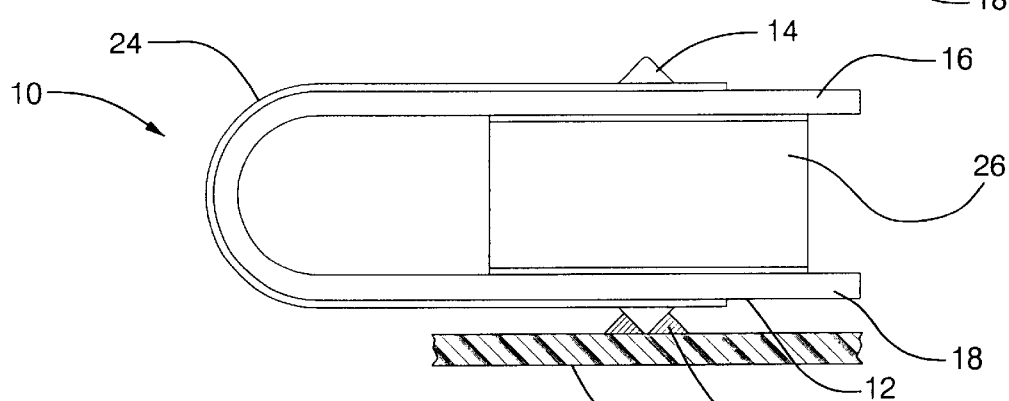
FIG. 2 is a side view of the Z-axis electrical interconnect of FIG. 1.
Figure 3:
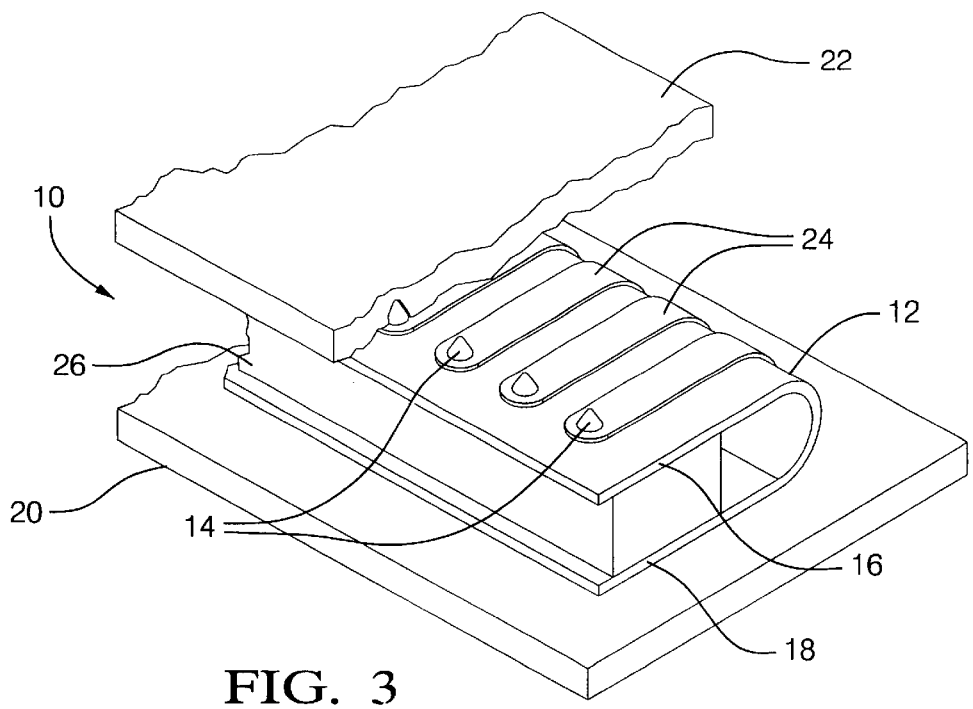
FIG. 3 is a perspective view of an installed Z-axis electrical interconnect.

Referring to FIGS. 1, 2 and 3, one embodiment of a Z-axis electrical interconnect 10 is illustrated. The Z-axis electrical interconnect 10 includes a flexible printed circuit such as a flexible circuit 12. It should be appreciated that, in this example, the flexible circuit 12 is a mandrel built flexible circuit. For example, to construct a mandrel built flexible circuit 12 a circuit (not shown) is imaged on the mandrel (not shown) in photoresist. The circuit is plated with a conductive material, such as copper. The resist is stripped off of the mandrel. A coverlet film is laminated over the circuit on the mandrel. An example of such a film is a material known as Kapton. While still on the mandrel, a layer of a conductive material such as nickel and a layer of gold is plated onto the pad using the coverlet as a plating resist. The flex is then removed from the mandrel, exposing the circuit traces on the other side of the circuit. A layer of electroless gold or tin-lead may be plated onto the nickel surface to establish a solderable surface. A further example of how this type of flexible circuit 12 is constructed is disclosed in a commonly assigned U.S. Pat. No. 5,207,887 to Crumly, et al., which issued on May 4, 1993, entitled "Semi-Additive Circuitry With Raised Features Using Formed Mandrels", the disclosure of which is hereby incorporated by reference.

The Z-axis electrical interconnect 10 includes a raised interconnection member 14 protruding from the flexible circuit 12. The raised interconnection member 14 is a bump made from an electrically conductive material such as copper. Preferably, the Z-axis electrical interconnect 10 includes a plurality of raised interconnection members 14 arranged in a predetermined pattern. In this example, the predetermined pattern is a row of raised interconnection members 14 positioned along a proximate end 16 and a distal end 18 of the flexible circuit 12. It should be appreciated that the raised interconnection member 14 provides a removable electrical contact between stacked first and second electrical devices 20, 22 as illustrated in FIG. 3. It should also be appreciated that the stacked electrical devices 20, 22 may be printed circuit boards.

The Z-axis electrical interconnect 10 also includes a circuit trace 24 positioned on a surface of the flexible circuit 12. The circuit trace 24 electrically connects the raised interconnection member 14 at the proximate end 16 of the flexible circuit 12 with the corresponding raised interconnection member 14 at the distal end 18 of the flexible circuit 12. It should also be appreciated that, because the Z-axis electrical interconnect 10 has a flexible circuit 12, the interconnect 10 can be tailored to have custom mating locations and raised interconnection members 14 on multiple rows.

The Z-axis electrical interconnect 10 is folded into a U-shape, with the raised interconnection member 14 facing outwardly. To maintain the shape, the Z-axis electrical interconnect 10 includes a spring 26 fixedly positioned between the proximate and distal ends 16, 18 of the folded flexible circuit 12. The spring 26 is bonded to the flexible circuit 12, such as with an adhesive. Preferably, the spring 12 is elastomeric so as to maintain the shape of the Z-axis electrical interconnect 10 while providing conformity and pressure to the raised interconnection members 14 when in contact with the first and second electrical devices 20, 22. Advantageously, the Z-axis electrical interconnect 10 requires a minimal insertion force to install and maintain contact between the stacked first and second electrical devices 20, 22.

Figure 4:
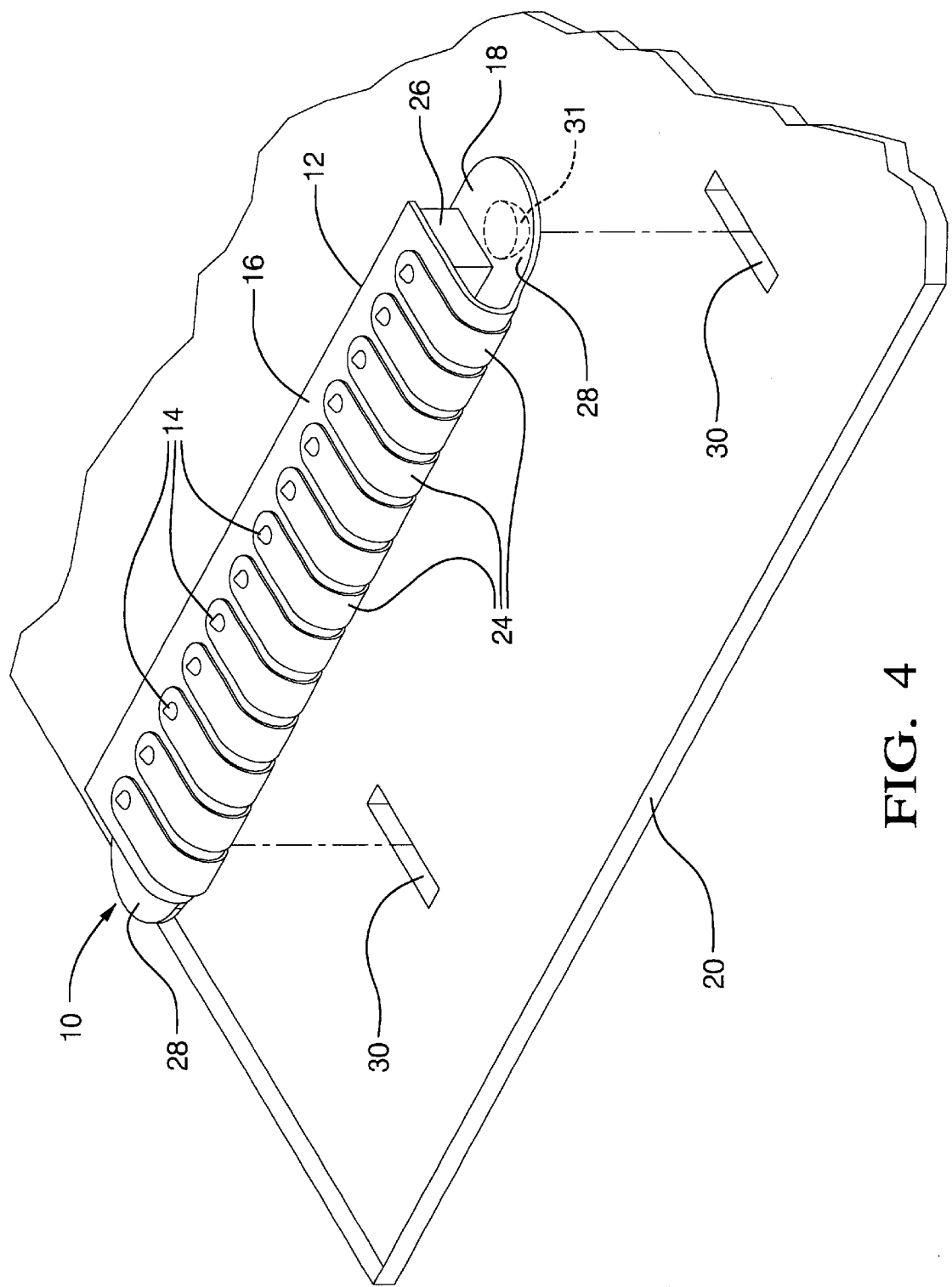
FIG. 4 is a perspective view of another embodiment of an installed Z-axis electrical interconnect.

In operation, the Z-axis electrical interconnect 10 is fixedly retained between the stacked first and second electrical devices 20, 22. The Z-axis electrical interconnect 10 may be retained on the electrical devices 20, 22 by known techniques such as soldering, bonding or fixturing. An example of fixturing is shown in FIG. 4. The Z-axis electrical interconnect 10 includes a tab 28 extending from the flexible circuit 12, such as from a side. Preferably, two tabs 28 are used, although there could be as many as four tabs 28. The Z-axis electrical interconnect 10 is positioned such that the raised interconnection member 14 is aligned with a mating contact (not shown) on the first electrical device 20. The tab 28 is aligned with a corresponding slit 30 in the first electrical device 20, inserted into the slit 30, and fixedly retained, such as by folding the tab 28 over. The tab 28 may also be bonded by an adhesive 31 to the first electrical device 20 to secure the Z-axis electrical interconnect 10 to the first electrical device 20.

Still another example of fixturing is illustrated in FIG. 2. In this example, solder 32 is used to secure the raised interconnection members 14 onto the first electrical device 20. It should be appreciated that conventional pick and place machines can automate this activity in large volumes.

The Z-axis electrical interconnect 10 is connected to the second electrical device 22 in a similar manner.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A Z-axis electrical interconnect for electrically connecting stacked electrical devices comprising:
   a flexible printed circuit folded into a U-shape, said flexible printed circuit having an outer surface, a proximate end and a distal end, wherein said outer surface at said proximate end faces away from said outer surface at said distal end as a consequence of the U-shape;
   a plurality of interconnection members arranged on the flexible printed circuit in a predetermined pattern on said outer surface at each of said proximate and distal ends, wherein said plurality of interconnection members are raised in relation to said outer surface;
   a circuit trace connecting said interconnection members at said distal end selectively with respect to said interconnection members at said proximate end; and
   a spring permanently bonded to said proximate and distal ends to thereby maintain the U-shape.

2. A Z-axis electrical interconnect as set forth in claim 1 wherein said interconnection members are soldered to an electrical device.

3. A Z-axis electrical interconnect as set forth in claim 1 wherein said predetermined pattern is a plurality of rows of interconnection members positioned along said flexible printed circuit.

4. A Z-axis electrical interconnect as set forth in claim 3 wherein said spring is elastomeric.

5. A Z-axis electrical interconnect as set forth in claim 4 wherein said spring is adhesively bonded to said flexible printed circuit.

6. A Z-axis electrical interconnect as set forth in claim 5 including a tab extending from an edge of said flexible printed circuit for fixedly retaining the Z-axis electrical interconnect to a device.

7. A Z-axis electrical interconnect as set forth in claim 6 including an adhesive to bond said tab to the device.

8. A Z-axis electrical interconnect for electrically connecting two stacked electrical devices comprising:
   a flexible printed circuit folded into a U-shape, said flexible printed circuit having an outer surface, an inner surface opposite said outer surface, a proximate end and a distal end, wherein said outer surface at said proximate end faces away from said outer surface at said distal end as a consequence of the U-shape;
   a first row of interconnection members positioned on said outer surface along said distal end of said flexible printed circuit and a second row of interconnection members positioned on said outer surface along said proximate end of said flexible printed circuit, wherein said interconnection members are raised in relation to said outer surface;
   a circuit trace connecting at least one of said interconnection members at said distal end of said flexible printed circuit with a corresponding one of said interconnection members at said proximate end of said flexible printed circuit; and
   a spring permanently bonded to said inner surface at both said distal end of said flexible printed circuit and said proximate end of said flexible printed circuit to thereby maintain the U-shape.

9. A Z-axis electrical interconnect as set forth in claim 8 wherein said spring is elastomeric.

10. A Z-axis electrical interconnect as set forth in claim 8 wherein said spring is adhesively bonded to said flexible printed circuit.

11. A Z-axis electrical interconnect as set forth in claim 8 including solder to secure said interconnection members to the electrical device.

12. A Z-axis electrical interconnect as set forth in claim 8 including a tab extending from an edge of said flexible printed circuit for fixedly retaining the Z-axis electrical interconnect to the electrical device.

13. A Z-axis electrical interconnect as set forth in claim 12 including an adhesive to bond said tab to the electrical device.

14. A Z-axis electrical interconnect for electrically connecting two stacked electrical devices comprising:
   a flexible printed circuit folded into a U-shape, said flexible printed circuit having an outer surface, an inner surface opposite said outer surface, a proximate end and a distal end, wherein said outer surface at said proximate end faces away from said outer surface at said distal end as a consequence of the U-shape;
   a first row of interconnection members positioned on said outer surface along said distal end of said flexible printed circuit and a second row of raised interconnection members positioned on said outer surface along said proximate end of said flexible printed circuit, wherein said interconnection members are raised in relation to said outer surface;
   a circuit trace connecting each of said interconnection members at said distal end of said flexible printed circuit with a corresponding interconnection member of said raised interconnection members at said proximate end of said flexible printed circuit;

an elastomeric spring permanently bonded to said inner surface at both said distal end of said flexible printed circuit and said proximate end of said flexible printed circuit to thereby maintain the U-shape; and a tab extending from an edge of said flexible printed circuit for fixedly retaining the Z-axis electrical interconnect to the devices.

15. A Z-axis electrical interconnect as set forth in claim 14 wherein said spring is adhesively bonded to said flexible printed circuit.

16. A Z-axis electrical interconnect as set forth in claim 14 including an adhesive to bond said tab to the devices.

17. A Z-axis electrical interconnect as set forth in claim 14 including solder to secure said raised interconnection members to the devices.

* * * * *